United States Patent [19]
Dobrovolny

[11] Patent Number: 5,027,163
[45] Date of Patent: Jun. 25, 1991

[54] HIGH LEVEL WIDE BAND RF MIXER

[75] Inventor: Pierre Dobrovolny, North Riverside, Ill.

[73] Assignee: Zenith Electronics Corporation, Glenview, Ill.

[21] Appl. No.: 281,156

[22] Filed: Dec. 6, 1988

[51] Int. Cl.$^5$ .............................................. H04B 1/16
[52] U.S. Cl. ..................................... 455/326; 455/323
[58] Field of Search ................ 455/326, 327, 323, 325

[56] References Cited

U.S. PATENT DOCUMENTS

| 4,590,616 | 5/1986 | Van Glabbeck | 455/326 |
|---|---|---|---|
| 4,727,596 | 2/1988 | Jaffer | 455/326 |
| 4,751,744 | 6/1988 | Pavio, Jr. | 455/326 |
| 4,949,398 | 8/1990 | Maas | 455/327 |

OTHER PUBLICATIONS

Application Note AN85-2 "A Commutation Double-Balanced MOSFET Mixer of High Dynamic Range", by Ed Oxner, Jan. 1986, Siliconix Inc., pp. 5-14.
Ham Radio Magazine, Mar. 1988, "High Dynamic Range Mixing With the Si8901", by Ed Oxner, Siliconix Inc., pp. 10-14.
"A GaAs MESFET Mixer With Very Low Intermodulation", by S. Maas, IEEE Transactions on Microwave Theory and Techniques, vol. MTT-35, No. 4, Apr. 1987, pp. 425-429.

Primary Examiner—Reinhard J. Eisenzopf
Assistant Examiner—Geoff Sutcliffe

[57] ABSTRACT

A wide band RF mixer includes a first bifilar balun transformer coupling a high level source of RF signal to the input winding of a trifilar balun transformer. The two output windings of the trifilar balun transformer are connected in series with the drain-source circuits of a pair of GaAs FET transistors. The source of each FET transistor is connected to ground. A local oscillator has a symmetric output signal that is coupled to a self-bias network and also to the gate electrodes of said FETs. An IF output signal is taken between ground and a common junction of the output balun windings. The arrangement provides a high level mixer with good intermodulation characteristics for ultra high frequencies.

12 Claims, 2 Drawing Sheets

HIGH LEVEL WIDE BAND RF MIXER

BACKGROUND OF THE INVENTION AND PRIOR ART

This invention relates in general to CATV mixers and in particular to a commutating type single-balanced resistive RF mixer that is operable with high level input signals.

It is known, for example, to provide a receiver having an ultra high frequency upconverting mixer wherein a local oscillator (LO) frequency of 1.1 gigahertz is used to develop a 600 megahertz intermediate frequency (IF) signal from a 500 megahertz radio frequency (RF) input signal. In many applications, the signal to noise ratio of the receiver is critical making it desirable to pre-amplify the received RF signal to the extent that it can be handled in a linear manner by the mixer. Any nonlinearities, such as those present in conventional diode mixers, give rise to intermodulation and other forms of distortions. Because of their relatively linear channel resistance, GaAs MESFETS have been used in an unbiased drain configuration to form narrow band, single-ended resistive mixers. The solution to the problem of achieving low intermodulation distortion with high signal handling capacity in a wideband balanced mixer has, however, still eluded the art.

In an article, entitled "A GaAs MESFET Mixer With Very Low Intermodulation," by Steven A. Mass in the IEEE Transactions on Microwave Theory Techniques, Volume MTT-35, #4 April, 1987, the foregoing prior art type of resistive mixer for high frequencies is described. The mixer described has low intermodulation distortion but, since it is a single ended device, i.e., it uses a single GaAs MESFET with both RF and IF signals appearing across the drain-source terminals of the MESFET, it is usable over only a relatively narrow frequency range, thereby limiting its use in many applications.

Another article, entitled "High Dynamic Range Mixing With the Si8901," by Ed Oxner in the March, 1988 issue of hr (ham radio), shows a doubly balanced commutation-type MOSFET mixer. The mixer is constructed in a bridge configuration with four MOSFETS and is usable over a relatively wide frequency range. This mixer suffers a disadvantage in that the source terminals of the MOSFETS cannot be connected to ground. Furthermore, the symmetric LO source feeding the gate electrodes is not an ideal floating source. Consequently, the control voltage applied to the gates is a combination of the LO voltage and the RF or IF voltage and the mixer switching action can be readily affected by signals other than the LO signal, which is certainly not an ideal situation. A similar mixer is shown in Siliconix Application Note AN85-2, "A Commutation Double-Balanced MOSFET Mixer of High Dynamic Range", January 1986.

The commutating single-balanced resistive mixer of the invention includes a very tightly coupled trifilar balun transformer for commutating the RF signal into the IF port and includes a pair of GaAs MESFETS for high speed, switching. The mixer has a relatively low conversion loss (about 6 db), good 50 ohm matching at both the RF and IF ports, a two tone third order intercept of about +36 dbm to +40 dbm and is capable of converting an RF frequency range of about 50-550 MHz into an IF frequency of about 600 MHz.

Objects of the Invention

A principal object of the invention is to provide an improved high level wide band resistive mixer.

Another object of the invention is to provide a novel single-balanced resistive mixer for high level wide band RF signals.

A still further object of the invention is to provide a high level resistive mixer which can be integrated with a symmetric local oscillator source on a common GaAs chip, except for the input baluns.

Yet another object of the invention is to provide a fundamental building block for double-balanced and other more complex mixer configurations.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
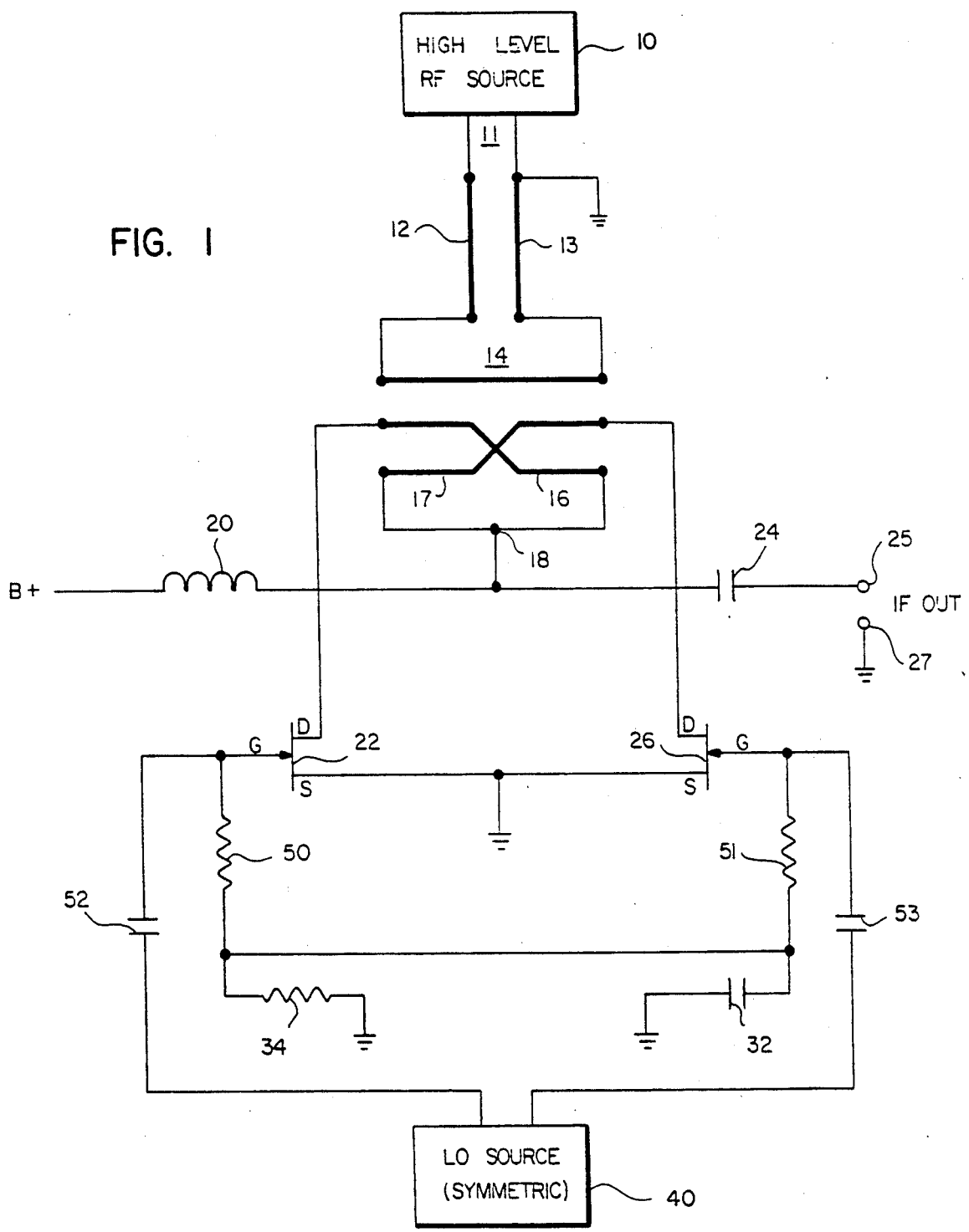
FIG. 1 is a partial block, partial schematic diagram of an RF mixer constructed in accordance with the invention.

Referring to FIG. 1, a source of high level RF signal 10 is shown coupled to a bifilar balun transformer 11 including a pair of windings 12 and 13 wound on a small toroidal ferrite core. As will be appreciated, windings in such a high frequency balun transformer are generally very tightly coupled together. The windings are illustrated in the drawings as heavy lines. Balun transformer 11 is in turn coupled to a trifilar balun transformer 14 that includes an input winding 15 and a pair of output windings 16 and 17, with output windings 16 and 17 each having one terminal connected together at a common junction 18. Windings 16 and 17 have their other terminals connected to respective drain electrodes of a pair of GaAs MESFET devices 22 and 26, respectively. These devices may comprise, for example, NEC MESFETS NE72084. The source electrodes of the MESFET devices are connected to ground and the gate electrodes are connected to a symmetric LO source 40 through capacitors 52 and 53. Resistors 34, 50 and 51 together with capacitors 32, 52 and 53 lower the RF gate-ground impedance of devices 22, 26 and develop a negative gate bias voltage therefor. Junction 18 is connected to a source of low positive B+ voltage (about 1.0 volts or less) through a choke 20 and through a capacitor 24 to an IF output terminal 25 which, together with a grounded terminal 27, comprises the IF output port of the mixer. The negative gate bias and positive B+ voltage are selected so as to provide minimum distortion and conversion loss. Also, the positive B+ voltage may cause some undesired leakage of the LO signal into the RF port. This may be overcome by suitable LO filtering at the RF port or by combining two individual mixers each as shown in FIG. 1 in a double-balanced embodiment, or both. Circuits such as hybrid couplers, baluns, etc. would then be required for suitably splitting, adding and canceling the RF and IF signals.

Figure 2:
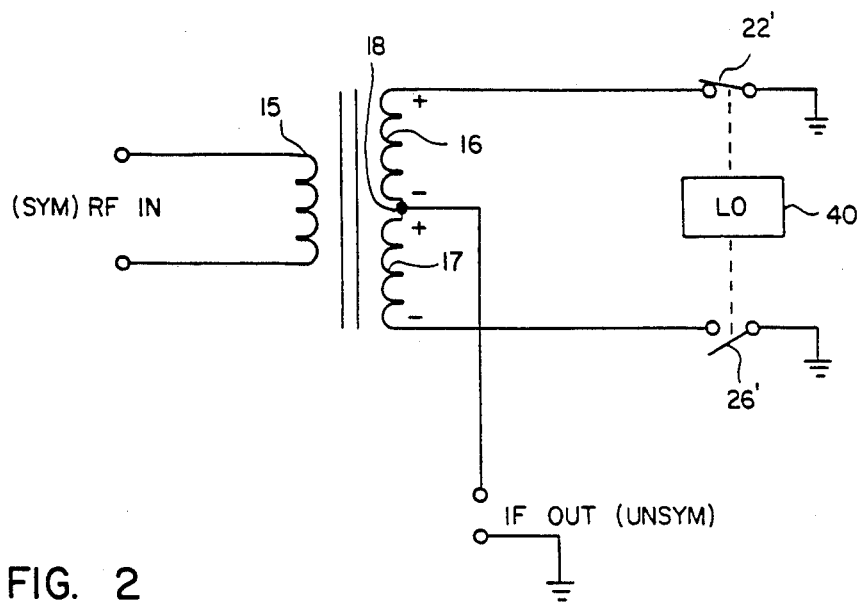
FIG. 2 is a simplified partial schematic diagram of the commutating mixer of the invention.

In FIG. 2, a simplified schematic diagram of the circuit arrangement of FIG. 1 is shown. As indicated, winding 15 serves as an RF input and induces equal like-polarity voltages in serially connected windings 16 and 17. The MESFETS 22 and 26 are represented by switches 22' and 26', respectively, and are effective to alternately connect the free terminals of windings 16 and 17 to ground when the switches 22' and 26' are closed under control of local oscillator 40, i.e., at the local oscillator frequency. As mentioned, the signal from local oscillator 40 is symmetrical as is the RF input signal across winding 15. The effect of these signals is to commutate or switch the polarity of the RF signal developed at the IF output terminal, the switching rate being determined by the local oscillator frequency.

Figure 3:
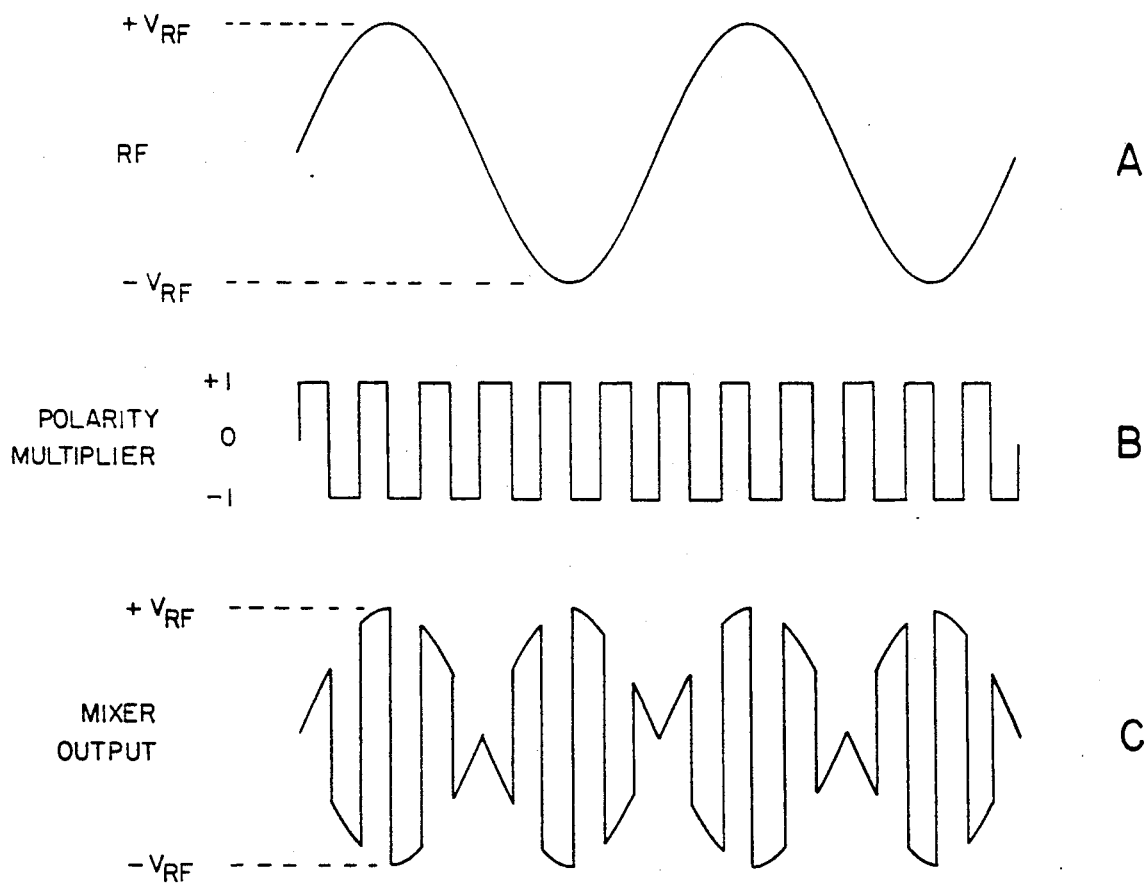
FIG. 3 is a series of waveforms illustrating the commutating action of the mixer of the invention.

Reference to FIG. 3 shows the effect of the commutation action, with waveform A representing an RF input signal; waveform B, a local oscillator-controlled polarity multiplier (i.e. representing the action of LO-controlled switches 22' and 26'); and waveform C, the resultant output signal available at the IF output terminal of the mixer. It will be understood that waveform C includes a multiplicity of harmonics including the desired IF output frequency, which may be derived by suitable filtering.

The operation of the commutating mixer of the invention is thus seen to be relatively straightforward. The benefit obtained by the use of a pair of high speed linear GaAs MESFETS supplied with a symmetrical RF input signal and a symmetrical local oscillator switching signal is that very sharp switching transitions with minimum intermodulation distortion are produced.

In the embodiment of the mixer illustrated in the drawings, the RF port has been considered the input port and the IF port the output port. These designations may, however, be readily interchanged or reversed with either port serving as the input port and the other port as the output port. Thus, in a more general sense, the two ports can be referred to as first and second input/output ports, with either of the two ports receiving an input signal and the other developing an output signal.

It will be appreciated that numerous modifications and changes in the described embodiment of the invention will occur to those skilled in the art without departing from its true spirit and scope. The invention is to be limited only as defined in the claims.

What is claimed is:

1. A wide band RF mixer comprising:
    a pair of field effect transistors, each having a grounded source, a drain and a gate;
    symmetric transformer means having first, second and third windings;
    means for coupling a symmetrical high level RF signal to said first winding;
    means connecting each of said second and said third windings in series with a respective one of said drain-source circuits of said field effect transistors, the connection between said second and said third windings forming a junction;
    means for coupling a symmetrical local oscillator signal for alternately activating the gates of said field effect transistors; and
    an IF port coupled between said junction and ground for developing an output signal including a desired intermediate frequency component.

2. The mixer of claim 1, further including means for coupling a DC voltage to said junction.

3. The mixer of claim 1, further including a first bifilar balun transformer for converting a high level RF input signal to said symmetrical high level RF signal.

4. The mixer of claim 1 wherein each of said field effect transistors comprises a MESFET.

5. The mixer of claim 4, further including a self-bias network for providing a negative bias to the gates of said MESFET's.

6. A wide band RF mixer comprising:
    a pair of field effect transistors, each having a grounded source, a drain and a gate;
    a trifilar balun transformer having first, second and third windings;
    means including a first bifilar balun transformer, for coupling a symmetrical high level RF signal to said first winding;
    LO means for coupling a symmetrical local oscillator signal to the gates of said field effect transistors;
    means joining said second and said third windings at a common junction point and for coupling said second and said third windings in series with the drain-source circuits of said field effect transistors;
    means for supplying a DC voltage to said junction;
    a self-bias network coupled to said LO means for coupling a biasing signal to the gates of said field effect transistors; and
    an IF port coupled between said junction and ground for developing an output signal including a desired intermediate frequency component.

7. The mixer of claim 6 wherein each of said field effect transistors comprises a MESFET.

8. A mixer circuit comprising:
    first transformer means providing a first input/output port;
    symmetric transformer means coupled to said first transformer means and having first, second and third windings;
    a pair of field effect transistors, each having a grounded source, a drain and a gate;
    means connecting said second and said third windings in series with the drain-source circuits of said field effect transistors, said series connection forming a junction between said second and third windings;
    means for coupling a symmetrical local oscillator signal for alternately activating the gates of said field effect transistors; and
    a second output/input port coupled between said junction and ground.

9. The mixer of claim 8, further including means for coupling a DC voltage to said junction.

10. The mixer of claim 8, wherein said first transformer means comprises a bifilar balun transformer.

11. The mixer of claim 8 wherein each of said field effect transistors comprises a MESFET.

12. The mixer of claim 11, further including a self-bias network for providing a negative bias to the gates of said MESFET's.

* * * * *